US012660267B2

(12) United States Patent
Tanaka et al.

(10) Patent No.: US 12,660,267 B2
(45) Date of Patent: Jun. 16, 2026

(54) SEMICONDUCTOR DEVICE COMPRISING FIRST BUFFER LAYER AND SECOND BUFFER LAYER WHEREIN A KURTOSIS OF A PEAK OF AN IMPURITY CONCENTRATION OF THE SECOND BUFFER LAYER IS LOWER THAN A KURTOSIS OF A PEAK OF AN IMPURITY CONCENTRATION OF THE FIRST BUFFER LAYER, AND METHOD OF MANUFACTURING THE SEMICONDUCTOR DEVICE

(71) Applicant: Mitsubishi Electric Corporation, Tokyo (JP)

(72) Inventors: Koji Tanaka, Tokyo (JP); Koichi Nishi, Tokyo (JP); Kakeru Otsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 750 days.

(21) Appl. No.: 17/937,676

(22) Filed: Oct. 3, 2022

(65) Prior Publication Data
US 2023/0187501 A1    Jun. 15, 2023

(30) Foreign Application Priority Data
Dec. 15, 2021    (JP) ................................. 2021-203341

(51) Int. Cl.
*H10D 62/17*        (2025.01)
*H10D 84/60*        (2025.01)
(Continued)

(52) U.S. Cl.
CPC ......... *H10D 62/393* (2025.01); *H10D 84/617* (2025.01); *H10P 30/204* (2026.01);
(Continued)

(58) Field of Classification Search
CPC .. H10D 62/393; H10D 84/617; H10D 12/441; H10D 12/032; H10D 62/60;
(Continued)

(56) References Cited

U.S. PATENT DOCUMENTS

2009/0184340 A1    7/2009    Nemoto et al.
2012/0064706 A1    3/2012    Nemoto et al.
(Continued)

FOREIGN PATENT DOCUMENTS

JP    2001-358154 A    12/2001
JP    2004-193212 A    7/2004
(Continued)

OTHER PUBLICATIONS

"Notice of Reasons for Refusal" Office Action issued in JP 2021-203341; mailed by the Japanese Patent Office on Oct. 8, 2024.

*Primary Examiner* — Mohammad M Hoque
(74) *Attorney, Agent, or Firm* — Studebaker Brackett PLLC

(57) ABSTRACT

A semiconductor device includes a semiconductor substrate having a drift layer of a first conductivity type and a collector layer of a second conductivity type. A first buffer layer having a higher impurity concentration peak than that of the drift layer is formed between the drift layer and the collector layer and a second buffer layer having a higher impurity concentration peak than that of the drift layer is formed between the first buffer layer and the collector layer. A kurtosis of a peak of an impurity concentration of the second buffer layer is lower than a kurtosis of a peak of an impurity concentration of the first buffer layer.

6 Claims, 12 Drawing Sheets

(51) Int. Cl.
    *H10P 30/20*          (2026.01)
    *H10P 34/42*          (2026.01)
(52) U.S. Cl.
    CPC ............ *H10P 30/21* (2026.01); *H10P 30/222*
                (2026.01); *H10P 34/42* (2026.01)
(58) Field of Classification Search
    CPC ................. H10D 12/01; H10D 12/411; H01L
             21/26513; H01L 21/26586; H01L 21/268;
                     H01L 21/263; H01L 21/26506
    USPC ......................................................... 257/140
    See application file for complete search history.

(56)                   References Cited

U.S. PATENT DOCUMENTS

| | | |
|---|---|---|
| 2017/0207330 A1 | 7/2017 | Enomoto |
| 2018/0053655 A1 | 2/2018 | Kawase |
| 2020/0058506 A1* | 2/2020 | Nakamura ............. H10D 8/411 |
| 2020/0161479 A1* | 5/2020 | Tamura .................. H10D 30/60 |
| 2021/0043738 A1* | 2/2021 | Agata .................. H10D 62/393 |
| 2021/0043739 A1* | 2/2021 | Kato ....................... H10D 62/60 |
| 2021/0082702 A1* | 3/2021 | Agata .................. H10D 64/112 |

FOREIGN PATENT DOCUMENTS

| | | |
|---|---|---|
| JP | 2009-176892 A | 8/2009 |
| JP | 2017-126724 A | 7/2017 |
| JP | 2020-188168 A | 11/2020 |
| WO | 2016/203545 A1 | 12/2016 |
| WO | 2020/230456 A1 | 11/2020 |

* cited by examiner

F I G.  1
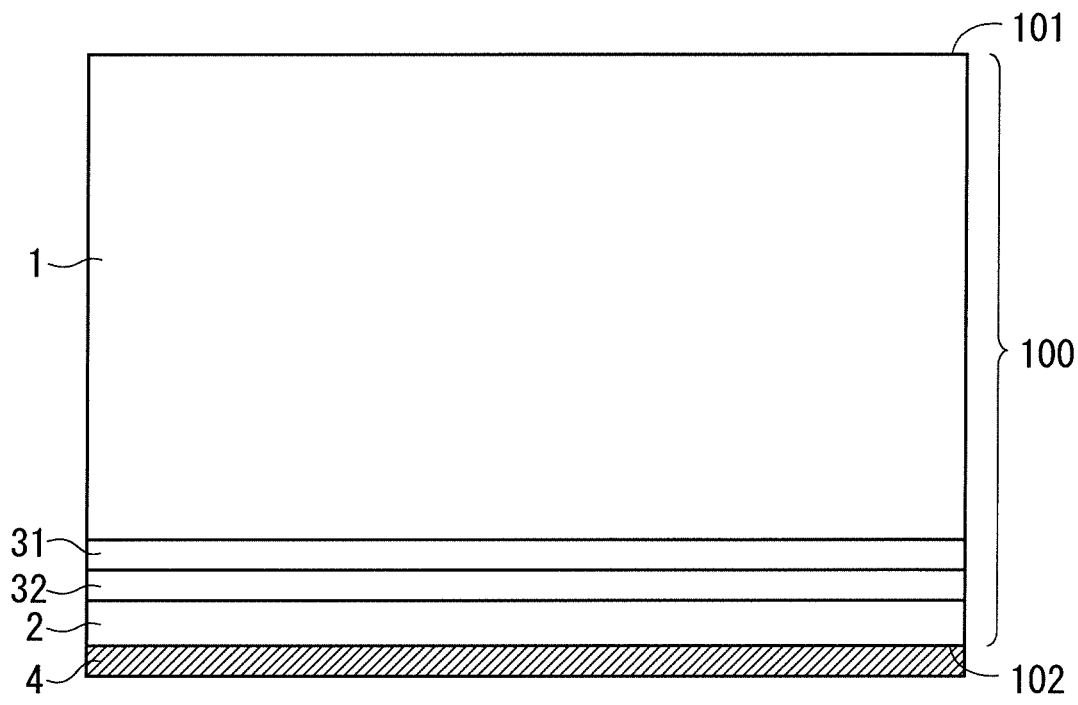

F I G .  2
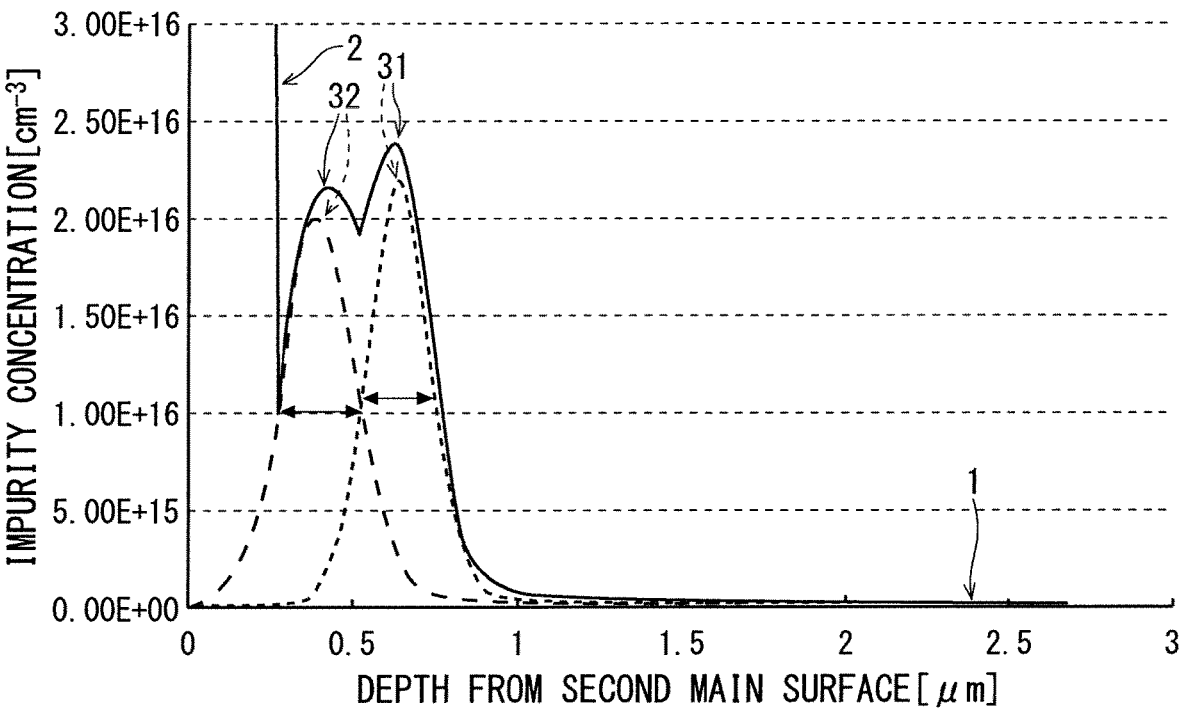

F I G. 3

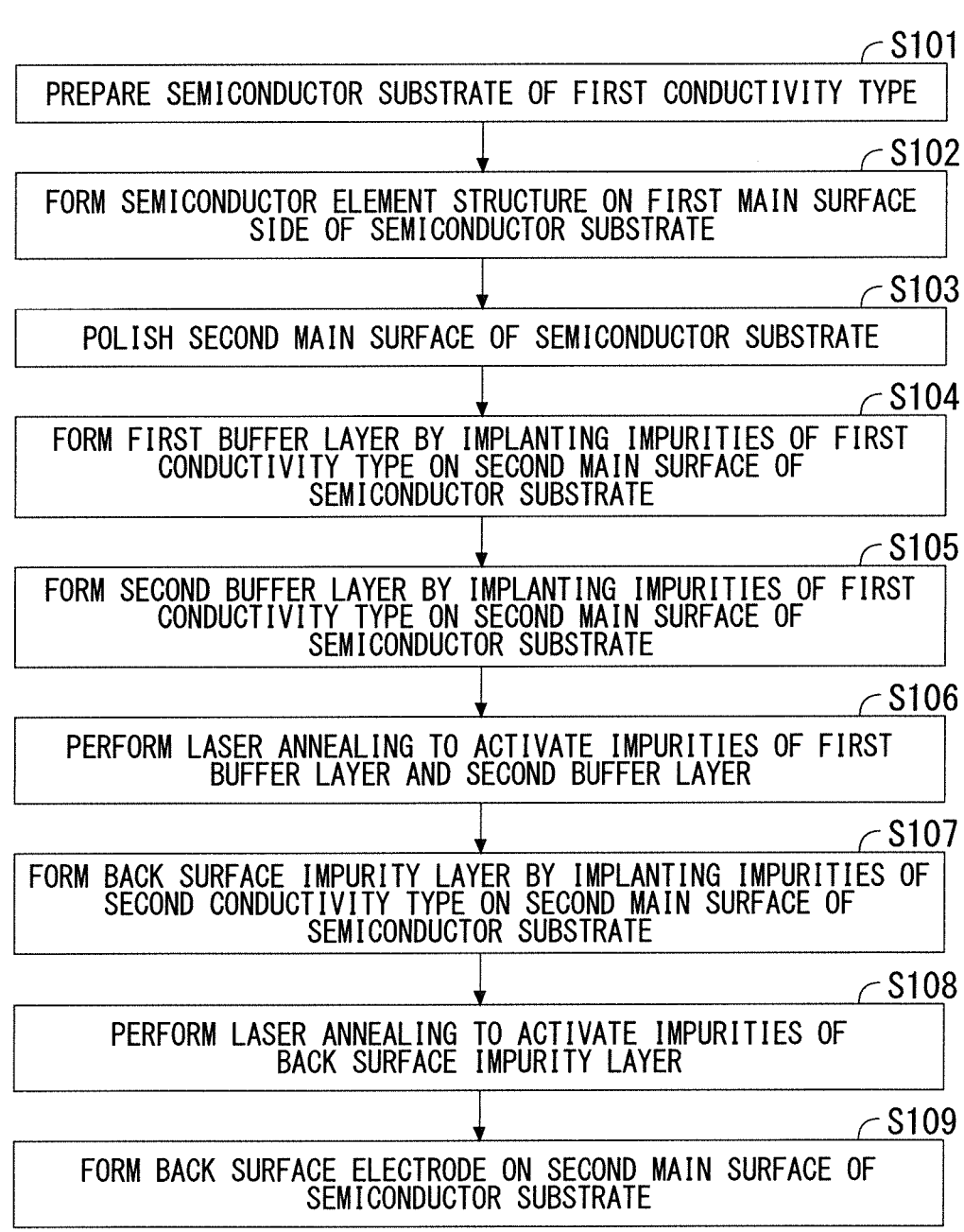

S101
PREPARE SEMICONDUCTOR SUBSTRATE OF FIRST CONDUCTIVITY TYPE

S102
FORM SEMICONDUCTOR ELEMENT STRUCTURE ON FIRST MAIN SURFACE
SIDE OF SEMICONDUCTOR SUBSTRATE

S103
POLISH SECOND MAIN SURFACE OF SEMICONDUCTOR SUBSTRATE

S104
FORM FIRST BUFFER LAYER BY IMPLANTING IMPURITIES OF FIRST
CONDUCTIVITY TYPE ON SECOND MAIN SURFACE OF
SEMICONDUCTOR SUBSTRATE

S105
FORM SECOND BUFFER LAYER BY IMPLANTING IMPURITIES OF FIRST
CONDUCTIVITY TYPE ON SECOND MAIN SURFACE OF
SEMICONDUCTOR SUBSTRATE

S106
PERFORM LASER ANNEALING TO ACTIVATE IMPURITIES OF FIRST
BUFFER LAYER AND SECOND BUFFER LAYER

S107
FORM BACK SURFACE IMPURITY LAYER BY IMPLANTING IMPURITIES OF
SECOND CONDUCTIVITY TYPE ON SECOND MAIN SURFACE OF
SEMICONDUCTOR SUBSTRATE

S108
PERFORM LASER ANNEALING TO ACTIVATE IMPURITIES OF
BACK SURFACE IMPURITY LAYER

S109
FORM BACK SURFACE ELECTRODE ON SECOND MAIN SURFACE OF
SEMICONDUCTOR SUBSTRATE

F I G. 4
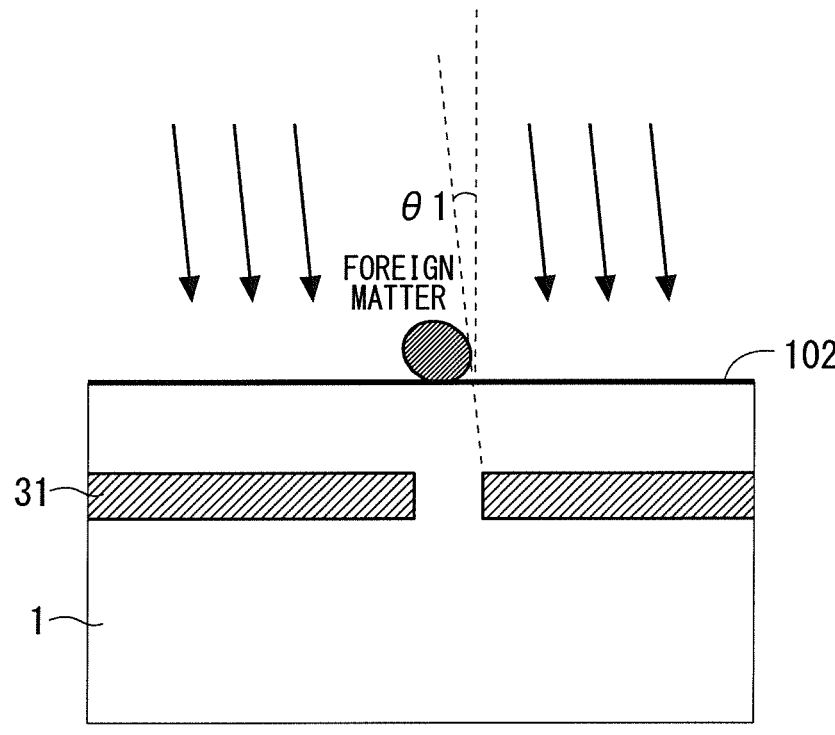

F I G.  5
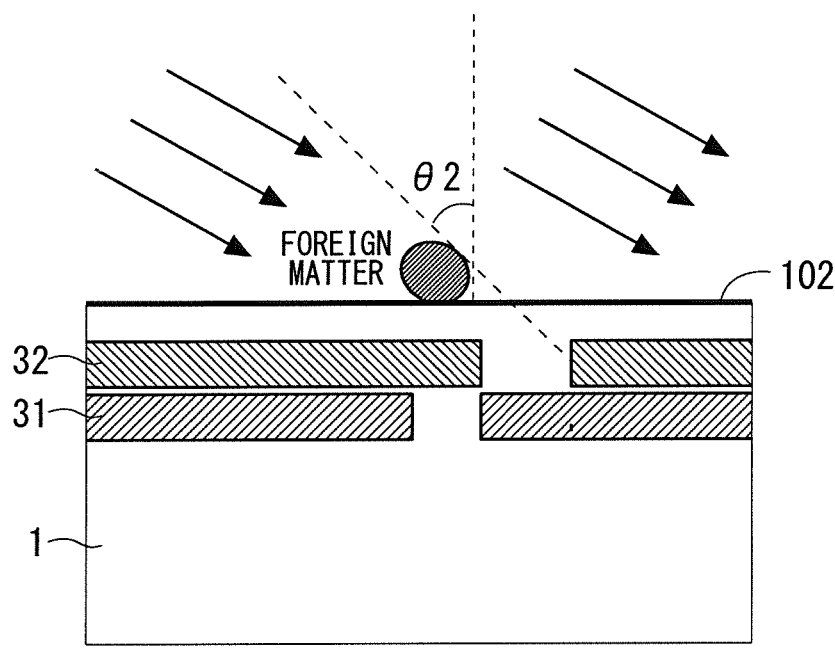

F I G.  6
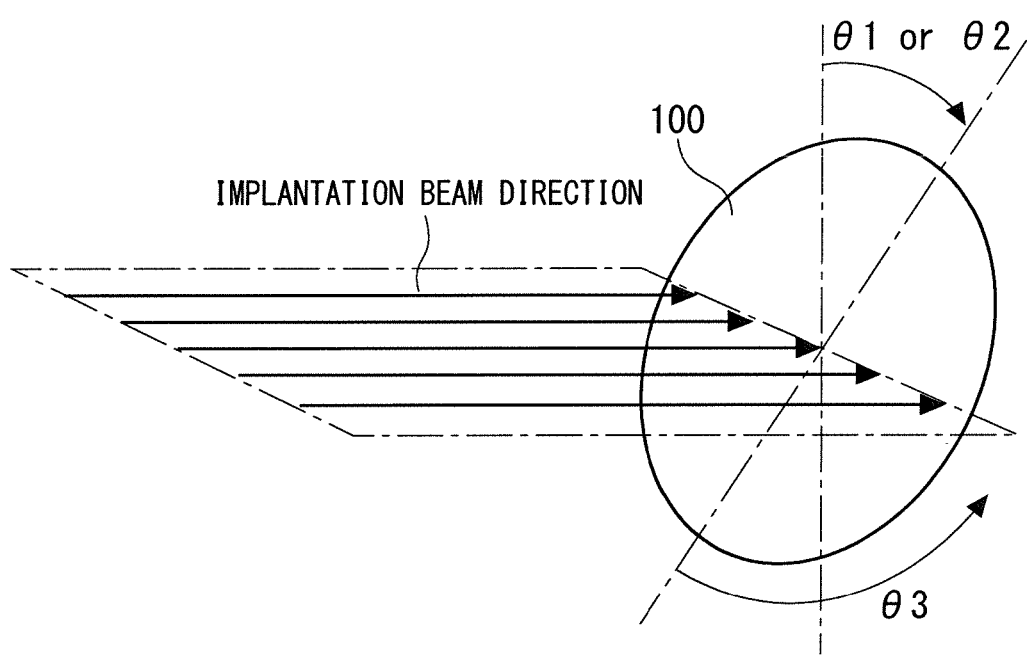

F I G.  7

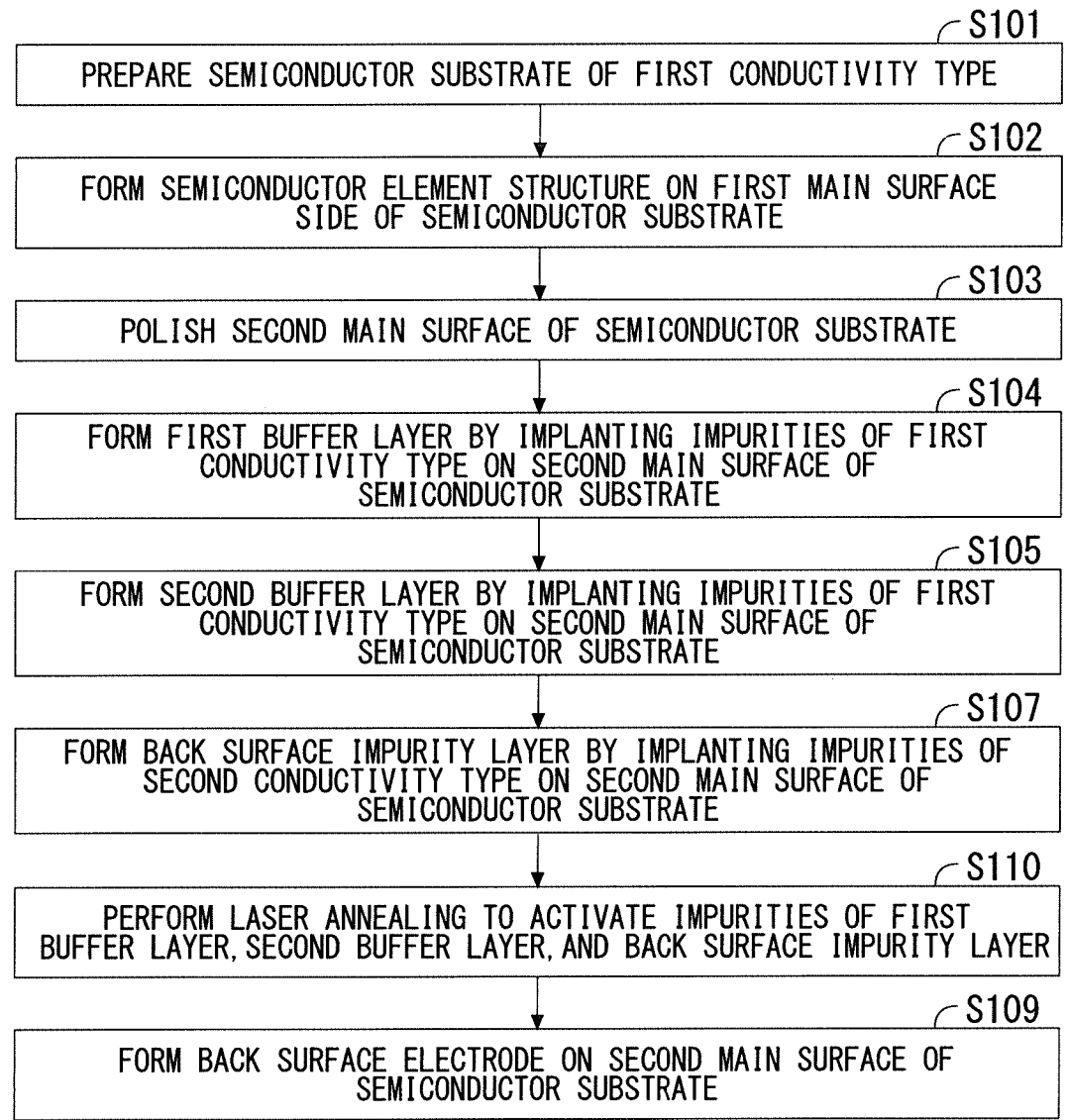

```
                                                            ┌ S101
  PREPARE SEMICONDUCTOR SUBSTRATE OF FIRST CONDUCTIVITY TYPE

┌ S102
  FORM SEMICONDUCTOR ELEMENT STRUCTURE ON FIRST MAIN SURFACE
            SIDE OF SEMICONDUCTOR SUBSTRATE

┌ S103
    POLISH SECOND MAIN SURFACE OF SEMICONDUCTOR SUBSTRATE

┌ S104
    FORM FIRST BUFFER LAYER BY IMPLANTING IMPURITIES OF FIRST
          CONDUCTIVITY TYPE ON SECOND MAIN SURFACE OF
                    SEMICONDUCTOR SUBSTRATE

┌ S105
   FORM SECOND BUFFER LAYER BY IMPLANTING IMPURITIES OF FIRST
          CONDUCTIVITY TYPE ON SECOND MAIN SURFACE OF
                    SEMICONDUCTOR SUBSTRATE

┌ S107
  FORM BACK SURFACE IMPURITY LAYER BY IMPLANTING IMPURITIES OF
       SECOND CONDUCTIVITY TYPE ON SECOND MAIN SURFACE OF
                    SEMICONDUCTOR SUBSTRATE

┌ S110
     PERFORM LASER ANNEALING TO ACTIVATE IMPURITIES OF FIRST
  BUFFER LAYER, SECOND BUFFER LAYER, AND BACK SURFACE IMPURITY LAYER

┌ S109
    FORM BACK SURFACE ELECTRODE ON SECOND MAIN SURFACE OF
                    SEMICONDUCTOR SUBSTRATE
```

F I G. 8
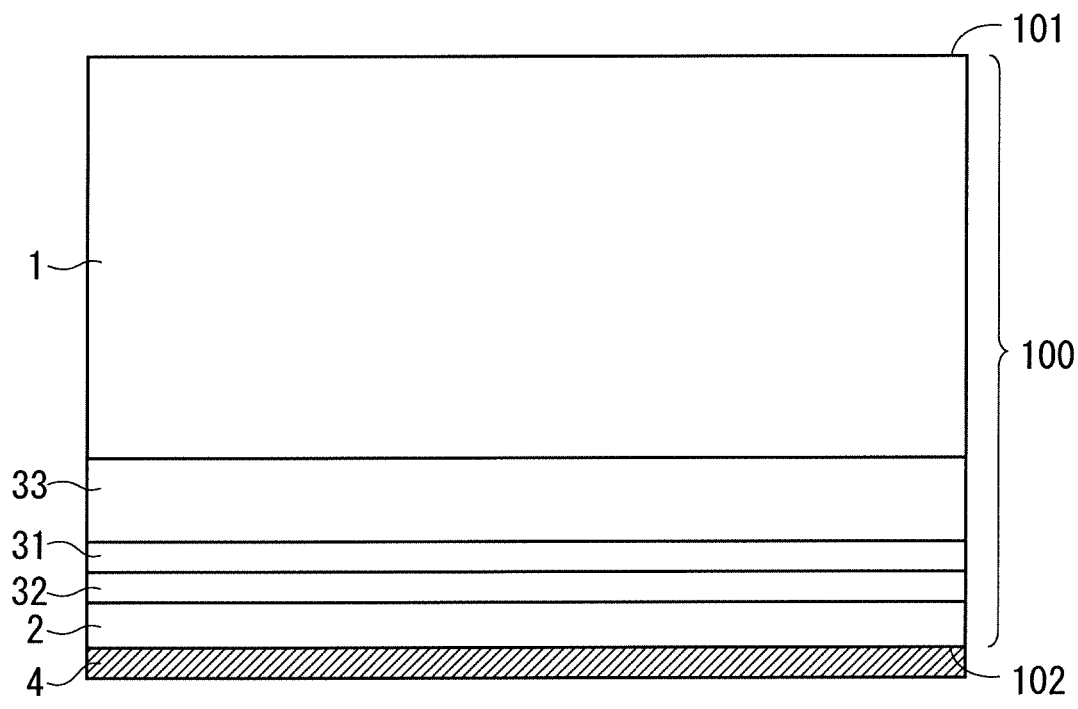

F I G. 9
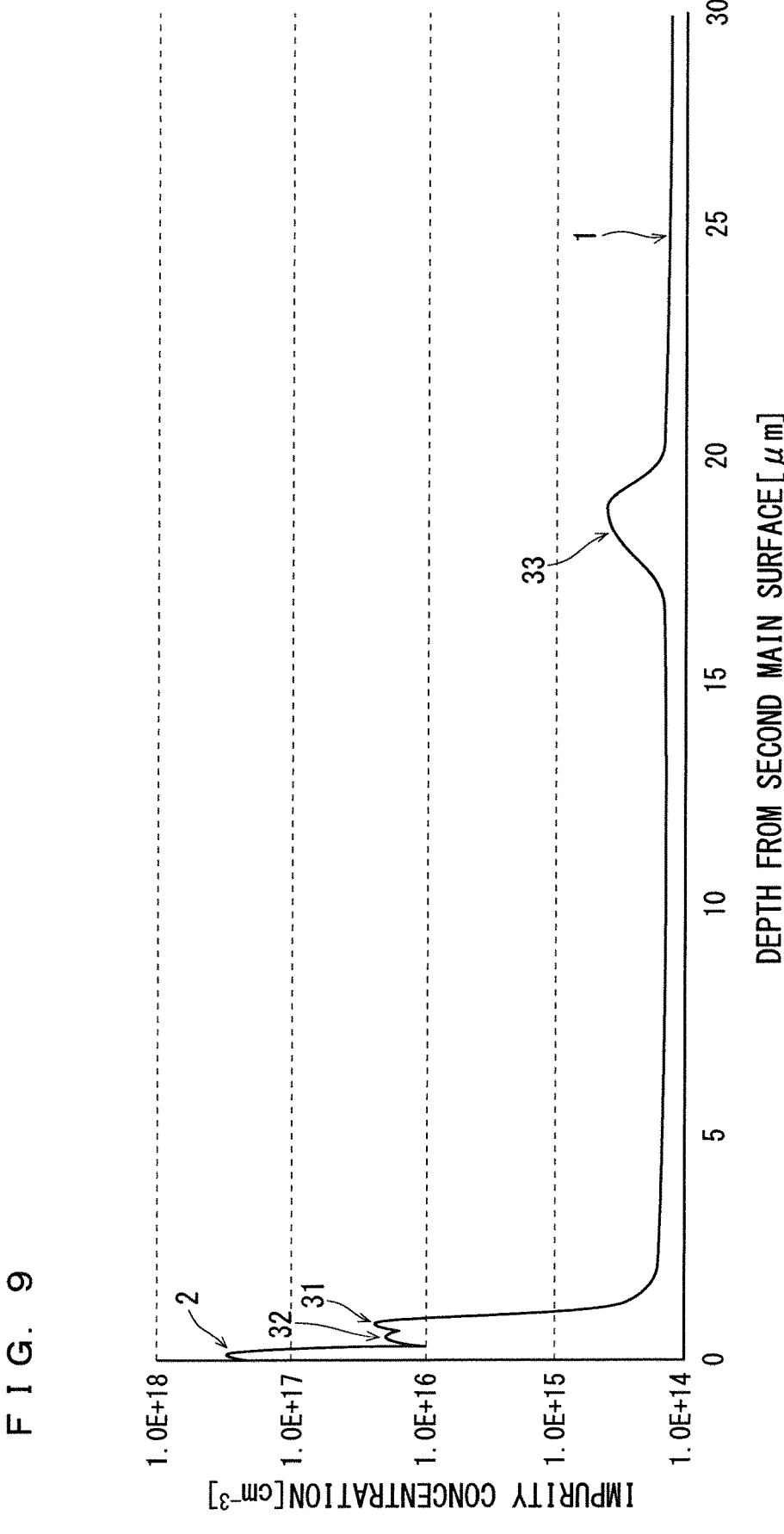

FIG. 10

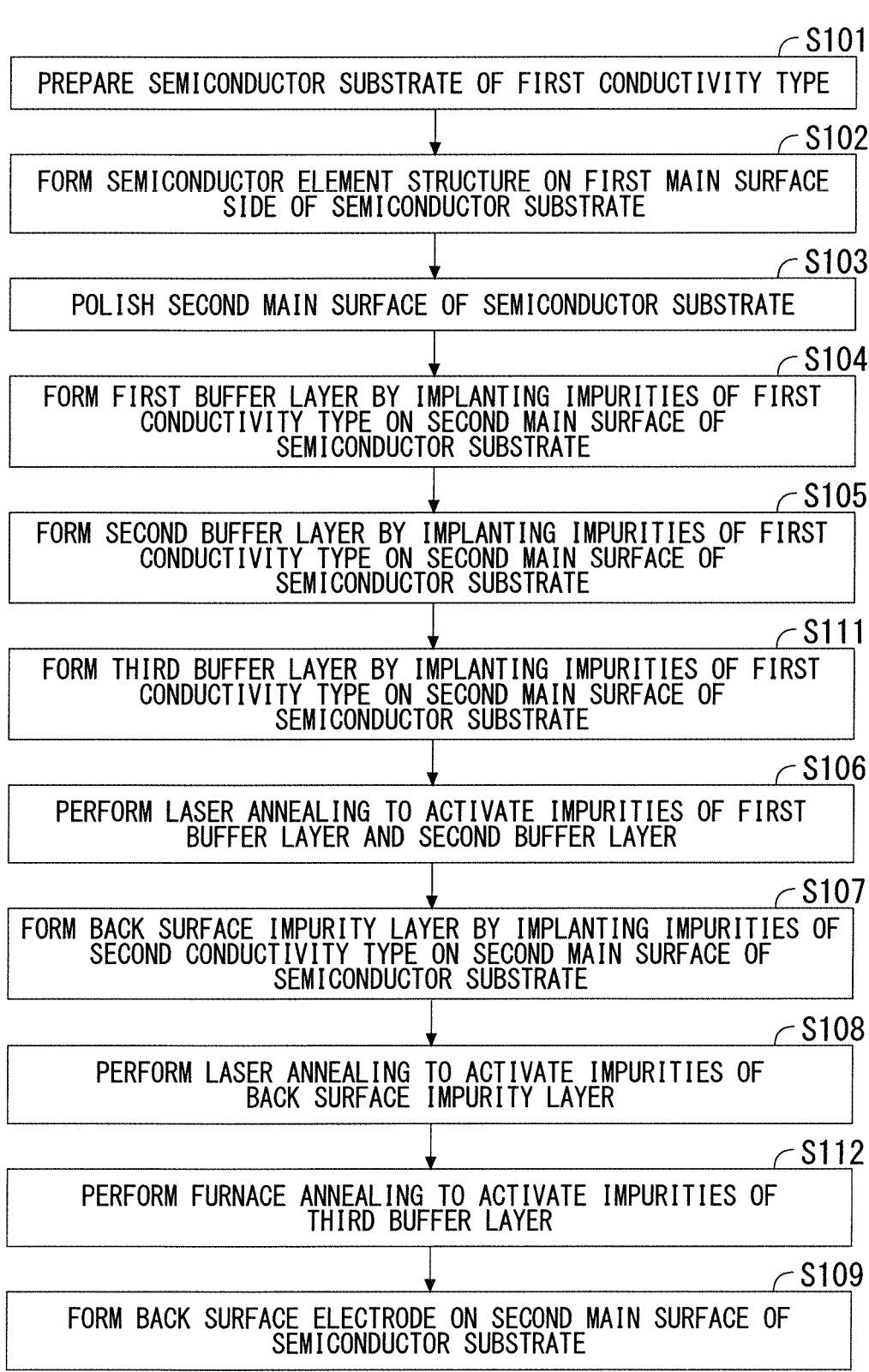

S101
PREPARE SEMICONDUCTOR SUBSTRATE OF FIRST CONDUCTIVITY TYPE

S102
FORM SEMICONDUCTOR ELEMENT STRUCTURE ON FIRST MAIN SURFACE
SIDE OF SEMICONDUCTOR SUBSTRATE

S103
POLISH SECOND MAIN SURFACE OF SEMICONDUCTOR SUBSTRATE

S104
FORM FIRST BUFFER LAYER BY IMPLANTING IMPURITIES OF FIRST
CONDUCTIVITY TYPE ON SECOND MAIN SURFACE OF
SEMICONDUCTOR SUBSTRATE

S105
FORM SECOND BUFFER LAYER BY IMPLANTING IMPURITIES OF FIRST
CONDUCTIVITY TYPE ON SECOND MAIN SURFACE OF
SEMICONDUCTOR SUBSTRATE

S111
FORM THIRD BUFFER LAYER BY IMPLANTING IMPURITIES OF FIRST
CONDUCTIVITY TYPE ON SECOND MAIN SURFACE OF
SEMICONDUCTOR SUBSTRATE

S106
PERFORM LASER ANNEALING TO ACTIVATE IMPURITIES OF FIRST
BUFFER LAYER AND SECOND BUFFER LAYER

S107
FORM BACK SURFACE IMPURITY LAYER BY IMPLANTING IMPURITIES OF
SECOND CONDUCTIVITY TYPE ON SECOND MAIN SURFACE OF
SEMICONDUCTOR SUBSTRATE

S108
PERFORM LASER ANNEALING TO ACTIVATE IMPURITIES OF
BACK SURFACE IMPURITY LAYER

S112
PERFORM FURNACE ANNEALING TO ACTIVATE IMPURITIES OF
THIRD BUFFER LAYER

S109
FORM BACK SURFACE ELECTRODE ON SECOND MAIN SURFACE OF
SEMICONDUCTOR SUBSTRATE

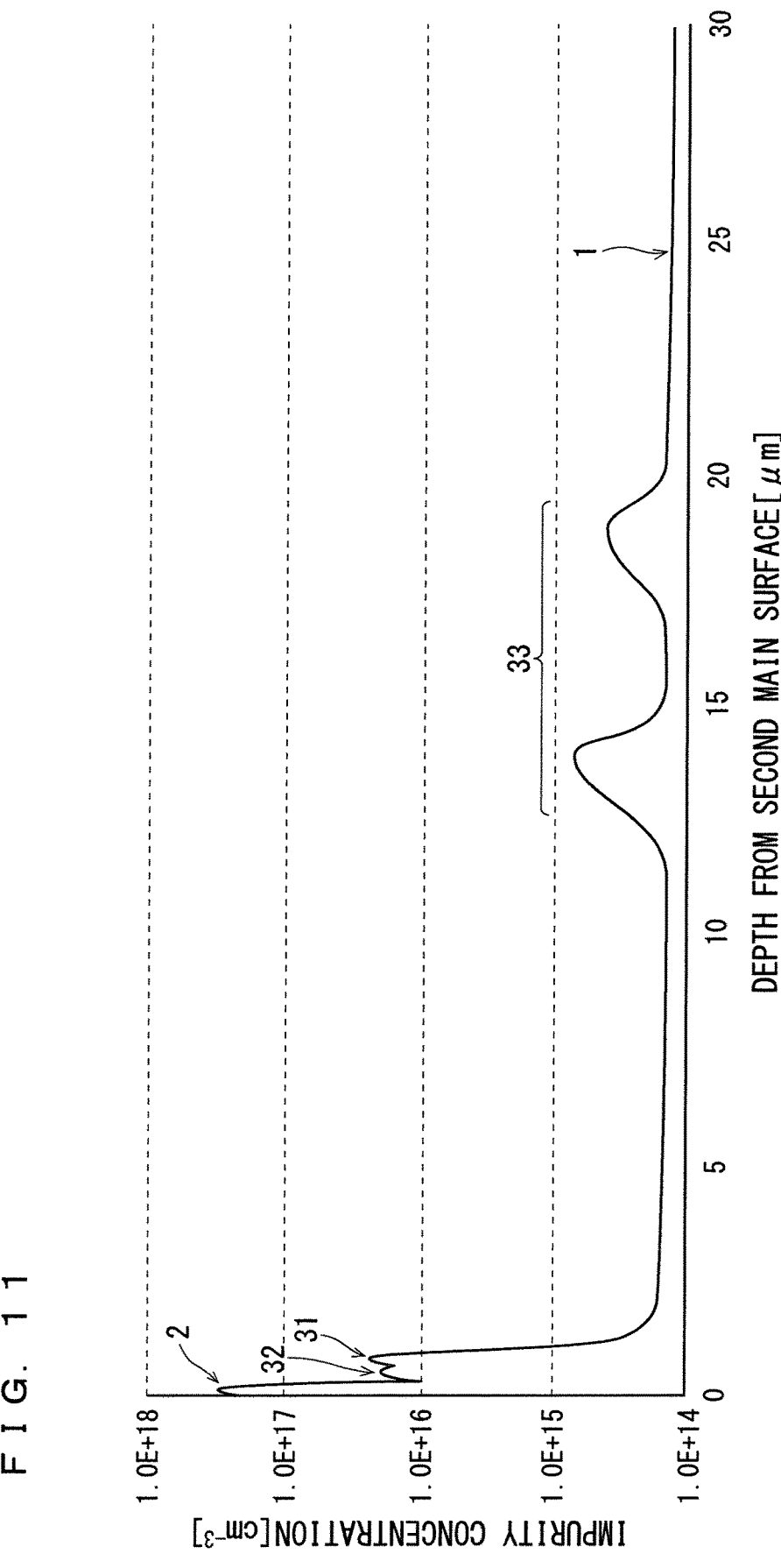
F I G .   1 1

F I G .  1 2
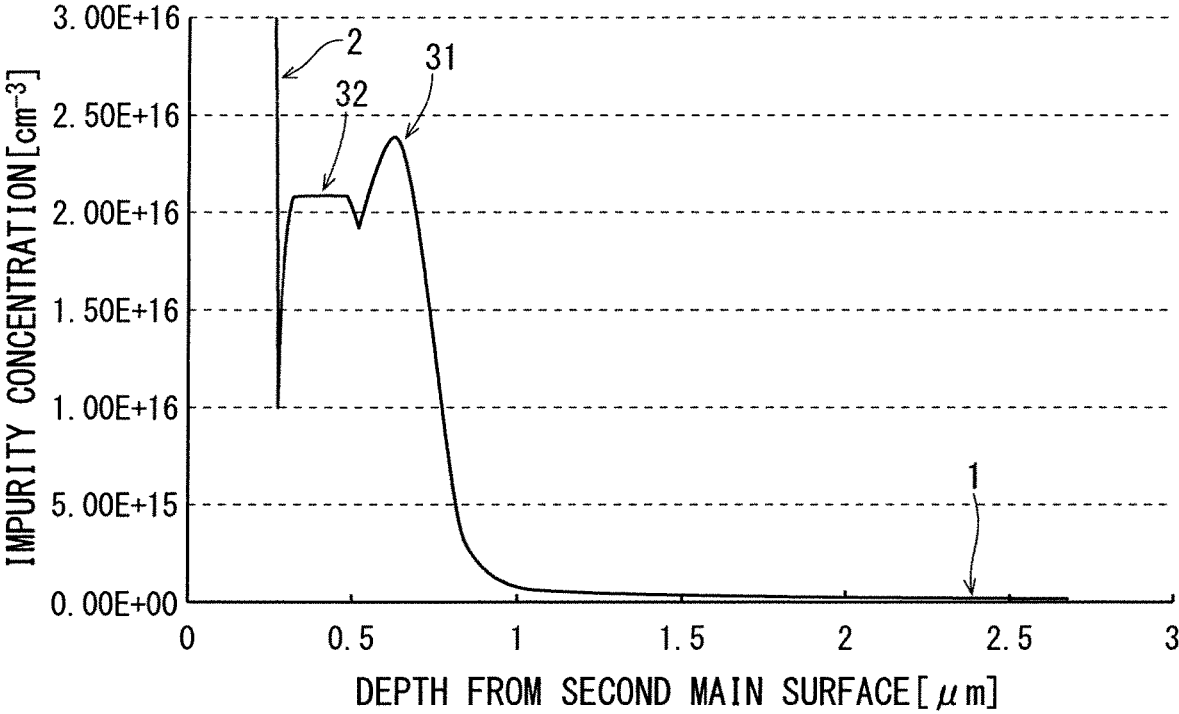

SEMICONDUCTOR DEVICE COMPRISING FIRST BUFFER LAYER AND SECOND BUFFER LAYER WHEREIN A KURTOSIS OF A PEAK OF AN IMPURITY CONCENTRATION OF THE SECOND BUFFER LAYER IS LOWER THAN A KURTOSIS OF A PEAK OF AN IMPURITY CONCENTRATION OF THE FIRST BUFFER LAYER, AND METHOD OF MANUFACTURING THE SEMICONDUCTOR DEVICE

BACKGROUND OF THE INVENTION

Field of the Invention

The present disclosure relates to a semiconductor device and a method of manufacturing the semiconductor device.

Description of the Background Art

For example, in a semiconductor device for power control such as an Insulated Gate Bipolar Transistor (IGBT), a structure has been known where, between a drift layer of a first conductivity type and a collector layer of a second conductivity type, a buffer layer of the first conductivity type having a higher impurity concentration than the drift layer is provided. For example, Japanese Patent Application Laid-Open No. 2020-188168 below discloses a technique for suppressing adverse effects on breakdown voltage characteristics and leakage current characteristics should damage be inflicted on the collector layer side by providing a plurality of buffer layers.

In the technique of Japanese Patent Application Laid-Open No. 2020-188168, a plurality of buffer layers are formed by performing the step of implanting impurities for forming a buffer layer into the semiconductor substrate multiple times while changing the dose amount and the acceleration voltage. In this method, when foreign matters are present on the implantation surface of the semiconductor substrate, sufficient suppression of adverse effects on breakdown voltage characteristics and leakage current characteristics cannot be reached in some cases because of the generation of non-implanted regions where no impurities are implanted, due to the foreign matters serving as a mask.

SUMMARY

An object of the present disclosure is to provide a technique that suppresses the generation of the non-implanted regions where no impurities are implanted even if foreign matters are present on the implantation surface of the semiconductor substrate when impurities are implanted to form a buffer layer.

According to the present disclosure, a semiconductor device includes a semiconductor substrate having a drift layer of a first conductivity type between a first main surface on a front side and a second main surface on a back side, a semiconductor element structure formed on the first main surface side of the semiconductor substrate, a back surface impurity layer of a second conductivity type formed on a surface portion of the semiconductor substrate on the second main surface side, a first buffer layer of a first conductivity type formed between the drift layer and the back surface impurity layer and having a higher impurity concentration peak than that of the drift layer, and a second buffer layer formed between the first buffer layer and the back surface impurity layer and having a higher impurity concentration peak than that of the drift layer. In an impurity concentration profile in a depth direction from the second main surface, a kurtosis of a peak of an impurity concentration of the second buffer layer is lower than a kurtosis of a peak of an impurity concentration of the first buffer layer.

According to the present disclosure, the generation of the non-implanted regions where no impurities are implanted is suppressed even if foreign matters are present on the implantation surface of the semiconductor substrate when impurities are implanted to form a buffer layer.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a diagram illustrating a configuration of a semiconductor device according to a first embodiment, particularly a configuration on a second main surface side of a semiconductor substrate;

FIG. 2 is a graph illustrating an impurity concentration profile near the second main surface of the semiconductor substrate in the semiconductor device according to the first embodiment;

FIG. 3 is a flowchart illustrating a method of manufacturing the semiconductor device according to the first embodiment;

FIG. 4 is a diagram for illustrating a step of forming a first buffer layer;

FIG. 5 is a diagram for illustrating a step of forming a second buffer layer;

FIG. 6 is a cross-sectional view of a modification example of a silicon carbide semiconductor device according to the first embodiment;

FIG. 7 is a flowchart illustrating a modification of the method of manufacturing the semiconductor device according to the first embodiment;

FIG. 8 is a diagram illustrating a configuration of a semiconductor device according to a second embodiment, particularly a configuration on a second main surface side of a semiconductor substrate;

FIG. 9 is a graph illustrating an impurity concentration profile near the second main surface of the semiconductor substrate in the semiconductor device according to the second embodiment;

FIG. 10 is a flowchart illustrating a method of manufacturing the semiconductor device according to the second embodiment;

FIG. 11 is a graph illustrating an impurity concentration profile near the second main surface of the semiconductor substrate in a modification of the semiconductor device according to the second embodiment; and FIG. 12 is a graph illustrating an impurity concentration profile near a second main surface of a semiconductor substrate in a semiconductor device according to a third embodiment.

DESCRIPTION OF THE PREFERRED EMBODIMENTS

First Embodiment

FIG. 1 is a diagram illustrating a configuration of a semiconductor device according to a first embodiment. The semiconductor device according to the first embodiment is formed using a semiconductor substrate 100. The semiconductor substrate 100 has a first main surface 101 being a main surface on the front side and a second main surface 102 being a main surface on the back side. FIG. 1 particularly illustrates the configuration of the second main surface side of the semiconductor substrate 100.

Although omitted in FIG. 1, semiconductor element structures such as IGBTs, Reverse Conducting IGBTs (RC-IGBT), and diodes are formed on the first main surface 101 side of the semiconductor substrate 100. In the following embodiments, although semiconductor elements formed in the semiconductor device are assumed to be the IGBTs, the semiconductor device may adopt semiconductor elements other than the IGBTs. Further, in the following description, although the N-type represents the first conductivity type and the P-type represents the second conductivity type, the P-type may represent the first conductivity type and the N-type may represent the second conductivity type.

As illustrated in FIG. 1, a drift layer 1 of the first conductivity type is formed between the first main surface 101 and the second main surface 102 of the semiconductor substrate 100. A collector layer 2, being a second conductivity type back surface impurity layer, is formed in the surface portion of the semiconductor substrate 100 on the second main surface 102 side. Further, a collector electrode 4, being a back surface electrode connected to the collector layer 2, is formed on the second main surface 102 of the semiconductor substrate 100.

A first buffer layer 31 and a second buffer layer 32 each having a higher impurity concentration peak than that of the drift layer 1 are formed between the drift layer 1 and the collector layer 2. The second buffer layer 32 is arranged at a position closer to the second main surface 102 than the first buffer layer 31 is. That is, the second buffer layer 32 is formed between the first buffer layer 31 and the collector layer 2.

The shallower the depth from the second main surface 102, the higher the breakdown voltage performance of the semiconductor device; therefore, the first buffer layer 31 and the second buffer layer 32 are preferably formed as shallow as possible. Specifically, the peak of the impurity concentration of the first buffer layer 31 and the peak of the impurity concentration of the second buffer layer 32 desirably fall within 1 μm from the second main surface 102.

FIG. 2 is a graph illustrating an impurity concentration profile near the second main surface 102 of the semiconductor substrate 100 in the semiconductor device according to the first embodiment. In the graph of FIG. 2, the horizontal axis represents the depth from the second main surface 102, and the vertical axis represents the impurity concentration. That is, the graph of FIG. 2 illustrates the impurity concentration profile in the depth direction from the second main surface 102.

In FIG. 2, the solid line graph represents the impurity concentration profile in which the first buffer layer 31 and the second buffer layer 32 overlap, that is, the impurity concentration profile in which the impurities implanted in the step of forming the first buffer layer 31 and the impurities implanted in the step of forming the second buffer layer 32 are integrated without distinguishing from one another. Meanwhile, the dotted line graph represents the impurity concentration profile of only the impurities implanted in the step of forming the first buffer layer 31, and the broken line graph represents the impurity concentration profile of only the impurities implanted in the step of forming the second buffer layer 32.

Hereinafter, "the impurity concentration profile of the first buffer layer 31" and "the impurity concentration profile of the second buffer layer 32" represent the impurity concentration profile in which the impurities implanted in the step of forming the first buffer layer 31 and the impurities implanted in the step of forming the second buffer layer 32 are integrated (solid line graph).

As illustrated in FIG. 2, in terms of full width at half maximum, the impurity concentration profile of only impurities implanted in the step of forming the second buffer layer 32 (broken line graph) is wider than the impurity concentration profile of only impurities implanted in the step of forming the first buffer layer 31 (dotted line graph). As a result, in the impurity concentration profile (solid line graph) of the first buffer layer 31 and the second buffer layer 32 in the depth direction from the second main surface 102, the kurtosis of the peak of the impurity concentration of the second buffer layer 32 is lower than the kurtosis of the peak of the impurity concentration of the first buffer layer 31. In other words, the kurtosis of the peak of the impurity concentration in the first buffer layer 31 is sharper than the kurtosis of the peak of the impurity concentration in the second buffer layer 32.

FIG. 3 is a flowchart illustrating a method of manufacturing the semiconductor device according to the first embodiment. Hereinafter, the method of manufacturing the semiconductor device according to first embodiment will be described with reference to FIG. 3.

First, the semiconductor substrate 100 of the first conductivity type having the first main surface 101 on the front side thereof and the second main surface 102 on the back side thereof is prepared (Step S101). First, the semiconductor substrate 100 of a first conductivity type having the first main surface 101 on the front side thereof and the second main surface 102 on the back side thereof is prepared (Step S101). However, the material of the semiconductor substrate 100 is not limited to silicon, and a wide bandgap semiconductor such as silicon carbide (SiC) may also be adopted. When a wide bandgap semiconductor is used, a semiconductor device excellent in operation at a high voltage, a large current, and a high temperature can be obtained as compared with a conventional semiconductor device using silicon.

Next, a semiconductor element structure (not illustrated) such as an IGBT is formed on the first main surface 101 side of the semiconductor substrate 100 (Step S102). Then, the second main surface 102 of the semiconductor substrate 100 is polished to make the semiconductor substrate 100 have a desired thickness (Step S103).

Next, the first buffer layer 31 is formed by implanting the first conductivity type impurities into the second main surface 102 of the semiconductor substrate 100 (Step S104). Further, by implanting the first conductivity type impurities into the second main surface 102 of the semiconductor substrate 100, the second buffer layer 32 is formed at a position closer to the second main surface 102 than the first buffer layer 31 is (Step S105). Then, laser annealing is performed as the first laser annealing that activates the impurities in the first buffer layer 31 and the second buffer layer 32 by the heat of the laser (Step S106).

In the present embodiment, although phosphorus (P) is used as impurities for forming the first buffer layer 31 and the second buffer layer 32, arsenic (As), selenium (Se) and the like may also be used. When the semiconductor substrate 100 made of silicon carbide is used, nitrogen (N) may be used as impurities for forming the first buffer layer 31 and the second buffer layer 32.

Here, the implantation amount, implantation angle, and acceleration voltage, which are the implantation conditions for impurities in the step of forming the first buffer layer 31, are defined as the first implantation amount, the first implantation angle, and the first acceleration voltage, respectively. Here, the implantation amount, implantation angle, and acceleration voltage, which are the implantation conditions for impurities in the step of forming the second buffer layer 32, are defined as the second implantation amount, the second implantation angle, and the second acceleration voltage, respectively.

In the present embodiment, the second implantation angle is set to be larger than the first implantation angle. For example, the first implantation angle is set to about 5°, and the second implantation angle is set to 30° or more and 60° or less. As a result, as illustrated in FIG. 2, the full width at half maximum of the impurity concentration profile of only the impurities implanted in the step of forming the second buffer layer 32 becomes wider than the full width at half maximum of the impurities of only the impurities implanted in the step of forming the first buffer layer 31. As a result, in the impurity concentration profile of the first buffer layer 31 and the second buffer layer 32, the kurtosis of the peak of the impurity concentration of the second buffer layer 32 is lower than the kurtosis of the peak of the impurity concentration of the first buffer layer 31.

Next, by implanting impurities of the second conductive type into the second main surface 102 of the semiconductor substrate 100, the collector layer 2 being a back surface impurity layer is formed on the surface portion on the second main surface 102 side of the semiconductor substrate 100 (Step S107). Then, laser annealing is performed as a second laser annealing that activates the impurities in the collector layer 2 with the heat of the laser (Step S108). As the impurities for forming the collector layer 2, for example, boron (B) is adoptable.

The collector electrode 4, being the back surface electrode, is formed on the second main surface 102 of the semiconductor substrate 100 at the end of the process (Step S109). As a result, the semiconductor device having the structure illustrated in FIG. 1 is obtained.

Here, it is assumed that a foreign matter is present on the second main surface 102 being the implantation surface, when impurities are implanted to form the first buffer layer 31 and the second buffer layer 32. In the step of forming the first buffer layer 31, the impurities are implanted at a relatively small first implantation angle $\theta 1$ as illustrated in FIG. 4, so that a non-implanted region is generated at a position substantially directly below the foreign matter. Meanwhile, in the step of forming the second buffer layer 32, the impurities are implanted at a relatively large second implantation angle $\theta 2$ as illustrated in FIG. 5, so that a non-implanted region is generated at the position deviated from the foreign matter (a position deviated from the non-implanted region of the first buffer layer 31). In this manner, even if the non-implanted regions are formed in both the first buffer layer 31 and the second buffer layer 32 by the foreign matter, the position of the non-implanted region of the first buffer layer 31 and the position of the non-implanted region of the second buffer layer 32 are deviated from each other, and occurrence of non-implanted regions extending through the first buffer layer 31 and the second buffer layer 32 are less likely to happen. Therefore, the breakdown voltage characteristic and the leak current characteristic are stabilized.

The first implantation amount, which is the implantation amount of the impurities in the step of forming the first buffer layer 31, and the second implantation amount, which is the implantation amount of the impurities in the step of forming the second buffer layer 32, may be the same. That is, the step of forming the first buffer layer 31 and the step of forming the second buffer layer 32 may be performed without changing the setting of the implantation amount of the impurities. In that case, in the second buffer layer 32 in which the impurities are implanted at the relatively large second implantation angle, the implantation depth becomes varied in a large manner, so that the peak of the impurity concentration in the second buffer layer 32 becomes lower than the peak of the impurity concentration of the first buffer layer 31 as illustrated in FIG. 2.

Further, the second buffer layer 32 is in contact with the collector layer 2, and depending on the conditions, the impurities in the second buffer layer 32 could work to substantially reduce the concentration of the impurities in the collector layer 2, potentially becoming the cause of problems such as the rising of the on-voltage of the semiconductor device and a decrease in the implanting amount of holes at the time of a short circuit. In order to prevent this from happening, the second implantation amount may be smaller than the first implantation amount.

The first acceleration voltage, which is the acceleration voltage for impurity implantation in the step of forming the first buffer layer 31 and the second acceleration voltage, which is the acceleration voltage for impurity implantation in the step of forming the second buffer layer 32, may be equivalent to each other. That is, the step of forming the first buffer layer 31 and the step of forming the second buffer layer 32 may be performed without changing the setting of the acceleration voltages for impurity implantation. Even in that case, the second buffer layer 32, in which the impurities are implanted at the relatively large second implantation angle, is formed in a shallow manner, so that the peak of the impurity concentration in the second buffer layer 32 becomes closer to the second main surface 102 than the peak of the impurity concentration of the first buffer layer 31 is, as illustrated in FIG. 2. Higher productivity can be obtained as compared with forming the first buffer layer 31 and the second buffer layer 32 at different depths by changing the acceleration voltage for impurity implantation.

The impurities, in the step of forming the first buffer layer 31, may be performed from a plurality of directions. Similarly, the impurities, in the step of forming the second buffer layer 32, may be performed from a plurality of directions. Specifically, in the step of forming the first buffer layer 31 or the step of forming the second buffer layer 32, the impurities may be implanted a plurality of times while changing the rotation angle $\theta 3$ of a wafer of the semiconductor substrate 100 as illustrated in FIG. 6. For example, the rotation angle $\theta 3$ may be set to 0°, 90°, 180°, and 270° to perform impurity implantation four times. As a result, the generation of non-implanted regions is further suppressed.

Further, in the flowchart illustrated in FIG. 3, after forming the first buffer layer 31 and the second buffer layer 32, the laser annealing is performed to activate the impurities in the first buffer layer 31 and the second buffer layer 32 (Step S106), and after forming the collector layer 2, the laser annealing is performed to activate the impurities in the collector layer 2 (Step S108). However, after all of the first buffer layer 31, the second buffer layer 32, and the collector layer 2 have been formed, the laser annealing to activate the impurities in the first buffer layer 31, the second buffer layer 32, and the collector layer 2 may be collectively performed. The flowchart in this case is illustrated in FIG. 7. FIG. 7 is a flowchart in which, from the flowchart of FIG. 3, Step S106 is omitted and Step S108 is replaced with Step S110. In Step S110, the laser annealing to activate the impurities in the first buffer layer 31, the second buffer layer 32, and the collector layer 2 are collectively performed. The other Steps are the same as those in FIG. 3; therefore, the description thereof is omitted here.

Second Embodiment

FIG. 8 is a diagram illustrating a configuration of a semiconductor device according to a second embodiment, particularly a configuration on a second main surface side of the semiconductor substrate 100. The semiconductor device according to the second embodiment is a semiconductor device in which a third buffer layer 33 is added, with respect to the configuration of the first embodiment, between the drift layer 1 and the first buffer layer 31, that is, at a position farther from the second main surface 102 than the first buffer layer 31 is. Other elements are basically the same as those in the first embodiment.

FIG. 9 is a graph illustrating an impurity concentration profile near the second main surface 102 of the semiconductor substrate 100 in the semiconductor device according to the second embodiment and illustrating the impurity concentration profile in the depth direction from the second main surface 102. As illustrated in FIG. 9, the peak of the impurity concentration of the third buffer layer 33 is higher than the peak of the impurity concentration of the drift layer 1, and is lower than the peaks of the impurity concentration of the first buffer layer 31 and the second buffer layer 32.

Providing the third buffer layer 33 suppresses more adverse effects on breakdown voltage characteristics and leakage current characteristics due to damage (such as non-implanted regions) occurring on the structure the collector layer 2 side of the drift layer 1 than in the case of the first embodiment. Further, this also allows the 5 expansion of a depletion to gradually halt during the switching operation of the semiconductor device, suppressing the jumping and oscillation of the voltage applied to the semiconductor device.

FIG. 10 is a flowchart illustrating a method of manufacturing the semiconductor device according to the second embodiment. FIG. 10 is a flowchart in which, in the flowchart of FIG. 3, Step S111 is added after Step S105, and Step S112 is added after Step S108.

In Step S111, by implanting the first conductivity type impurities into the second main surface 102 of the semiconductor substrate 100, the third buffer layer 33 is formed at a position farther from the second main surface 102 than the first buffer layer 31 is. In Step S112, furnace annealing is performed to activate the impurities in the third buffer layer 33. In the present embodiment, protons are used as impurities for forming the third buffer layer 33, and the temperature of furnace annealing to activate the protons is set to about 400° C. The other Steps are the same as those in FIG. 3; therefore, the description thereof is omitted here.

Also in the present embodiment, similar to the flow of FIG. 7, laser annealing that activates the impurities in the first buffer layer 31, the second buffer layer 32, and the collector layer 2 may be collectively performed after all of the first buffer layer 31, the second buffer layer 31, and the second buffer layer 2 are formed.

Although FIG. 9 illustrates an example in which the impurity concentration profile of the third buffer layer 33 has a single peak, as illustrated in FIG. 11, the impurity concentration profile of the third buffer layer 33 may have a plurality of peaks of different depths from the second main surface 102.

Third Embodiment

FIG. 12 is a graph illustrating an impurity concentration profile near the second main surface of the semiconductor substrate in the semiconductor device according to a third embodiment and illustrating the impurity concentration profile in the depth direction from the second main surface 102. The configuration of the semiconductor device according to the third embodiment, particularly the configuration on the second main surface side of the semiconductor substrate, is the same as that in FIG. 1, in which the first buffer layer 31 and the second buffer layer 32 are formed between the drift layer 1 and the collect layer 2.

As illustrated in FIG. 12, the second buffer layer 32 is located between the first buffer layer 31 and the collector layer 2, in the impurity concentration profile of the first buffer layer 31 and the second buffer layer 32 in the depth direction from the second main surface 102, the kurtosis of the peak of the impurity concentration of the second buffer layer 32 is lower than the kurtosis of the peak of the impurity concentration of the first buffer layer 31. Further, the second buffer layer 32 has a lower peak impurity concentration than that of the first buffer layer 31, and in the impurity concentration profile of the second buffer layer 32, a flat region with a width of 100 nm or more, in which the impurity concentration of the second buffer layer 32 is 95% or more of the maximum value exists in the vicinity of the peak.

With the impurity concentration profile of the second buffer layer 32 having a flat region in the vicinity of the peak, the expansion of the depletion layer is made more likely to halt during the switching operation of the semiconductor device; therefore, stable breakdown voltage characteristics and leak current characteristics can be obtained.

The manufacturing method of the semiconductor device according to the third embodiment may be basically the same as the manufacturing method illustrated in the first embodiment. Laser annealing to activate the impurities of the first buffer layer 31 is performed with output at a level that is sufficient enough to melt the semiconductor substrate 100, thereby obtaining a desired impurity concentration profile.

The embodiments can be combined, appropriately modified or omitted, without departing from the scope of the disclosure.

While the disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
a semiconductor substrate having a drift layer of a first conductivity type between a first main surface on a front side and a second main surface on a back side;
a semiconductor element structure formed on the first main surface side of the semiconductor substrate;
a back surface impurity layer of a second conductivity type formed on a surface portion of the semiconductor substrate on the second main surface side;
a first buffer layer of the first conductivity type formed between the drift layer and the back surface impurity layer and having a higher impurity concentration peak than that of the drift layer; and a second buffer layer of the first conductivity type formed between the first buffer layer and the back surface impurity layer and having a higher impurity concentration peak than that of the drift layer, wherein, in an impurity concentration profile in a depth direction from the second main surface, a kurtosis of a peak of an impurity concentration of the second buffer layer is lower than a kurtosis of a peak of an impurity concentration of the first buffer layer, and the peak of the impurity concentration of the second buffer layer is a closest peak of impurity concentration to the back surface impurity layer in a thickness direction extending between the first main surface and the second main surface.

2. The semiconductor device according to claim 1, wherein the peak of the impurity concentration of the second buffer layer is lower than the peak of the impurity concentration of the first buffer layer.

3. The semiconductor device according to claim 1, wherein the peak of the impurity concentration of the first buffer layer and the peak of the impurity concentration of the second buffer layer fall within 1 μm from the second main surface.

4. The semiconductor device according to claim 1, wherein in the impurity concentration profile in the depth direction from the second main surface, a region with a width of 100 nm or more, in which the impurity concentration of the second buffer layer is 95% to 100% of the maximum value of the impurity concentration of the second buffer layer, exists.

5. The semiconductor device according to claim 1, further comprising a third buffer layer of the first conductivity type formed between the drift layer and the first buffer layer, having the peak of the impurity concentration higher than that of the drift layer and lower than those of the first buffer layer and the second buffer layer.

6. The semiconductor device according to claim 5, wherein the third buffer layer has a plurality of peaks of different depths from the second main surface.

* * * * *